United States Patent
Motoda et al.

[11] Patent Number: 6,010,570
[45] Date of Patent: Jan. 4, 2000

[54] APPARATUS FOR FORMING COATING FILM FOR SEMICONDUCTOR PROCESSING

[75] Inventors: Kimio Motoda, Kumamoto; Tetsu Kawasaki, Yamanashi-ken, both of Japan

[73] Assignee: Tokyo Electron Limited, Tokyo, Japan

[21] Appl. No.: 08/914,819

[22] Filed: Aug. 20, 1997

[30] Foreign Application Priority Data

Aug. 30, 1996 [JP] Japan .................................. 8-249230

[51] Int. Cl.⁷ ...................................................... B05C 5/00
[52] U.S. Cl. .......................... 118/323; 118/302; 118/305; 118/669; 118/671; 118/683; 118/696; 118/712; 118/600; 156/578; 239/104; 239/106; 239/112; 239/69; 222/160; 222/52; 222/55
[58] Field of Search ........................ 118/302, 323, 118/305, 300, 669, 671, 683, 696, 712, 600; 156/356, 357, 378, 367, 368, 578; 239/104, 106, 112, 722, 69; 222/160, 52, 55

[56] References Cited

U.S. PATENT DOCUMENTS

| 5,002,008 | 3/1991 | Ushijima et al. ...................... 118/302 |
| 5,094,884 | 3/1992 | Hillman et al. . |
| 5,119,759 | 6/1992 | Hicks ..................................... 118/323 |
| 5,127,362 | 7/1992 | Iwatsu et al. . |
| 5,183,508 | 2/1993 | Cholinski ............................... 118/683 |
| 5,350,452 | 9/1994 | Rempe et al. ......................... 118/609 |
| 5,853,812 | 12/1998 | Kawasaki et al. ..................... 118/302 |

FOREIGN PATENT DOCUMENTS

| 4-124812 | 4/1992 | Japan . |
| 5-55133 | 3/1993 | Japan . |
| 7-326554 | 12/1995 | Japan . |

OTHER PUBLICATIONS

Patent Abstracts of Japan, vol. 9, No. 308 (P–410) (2031), Dec. 4, 1985, JP 60–140350, Jul. 25, 1985.

Derwent Abstracts, AN–96–066540, JP 7–326554, Dec. 12, 1995.

*Primary Examiner*—Laura Edwards
*Attorney, Agent, or Firm*—Oblon, Spivak, McClelland, Maier & Neustadt, P.C.

[57] ABSTRACT

Disclosed is an apparatus for forming a coating film for semiconductor processing, including a holder for holding a substrate, a coating solution supply device arranged to face one main surface of the substrate held by the holder and provided with a discharge port for supplying a coating solution onto the one main surface of the substrate, the coating solution forming a band-like stream having a width smaller than that of the substrate, a moving device for moving the coating solution supply device in parallel and relative to the substrate held by the holder to form a coating region and a non-coating region on the one main surface of the substrate, and a clearance retaining device for maintaining constant the distance between the discharge port of the coating solution supply device and the one main surface of the substrate.

24 Claims, 7 Drawing Sheets

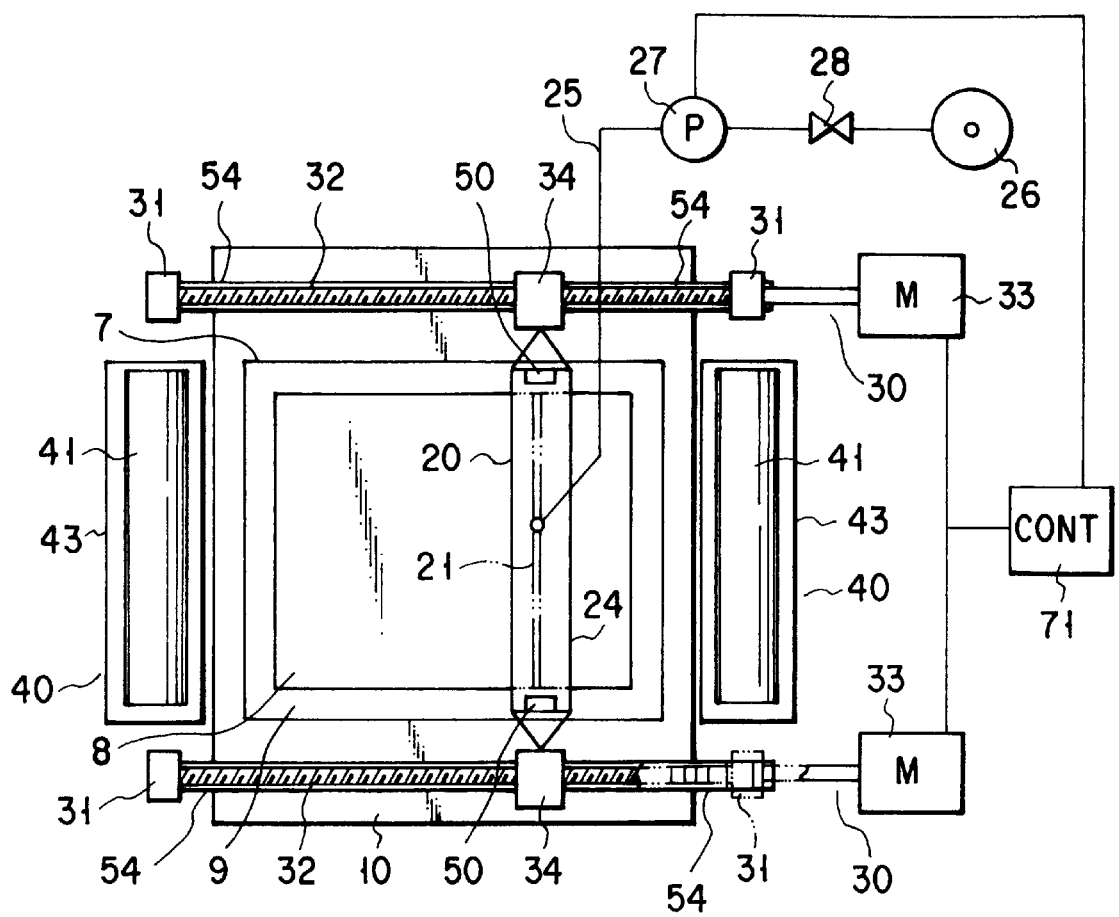
F I G. 3
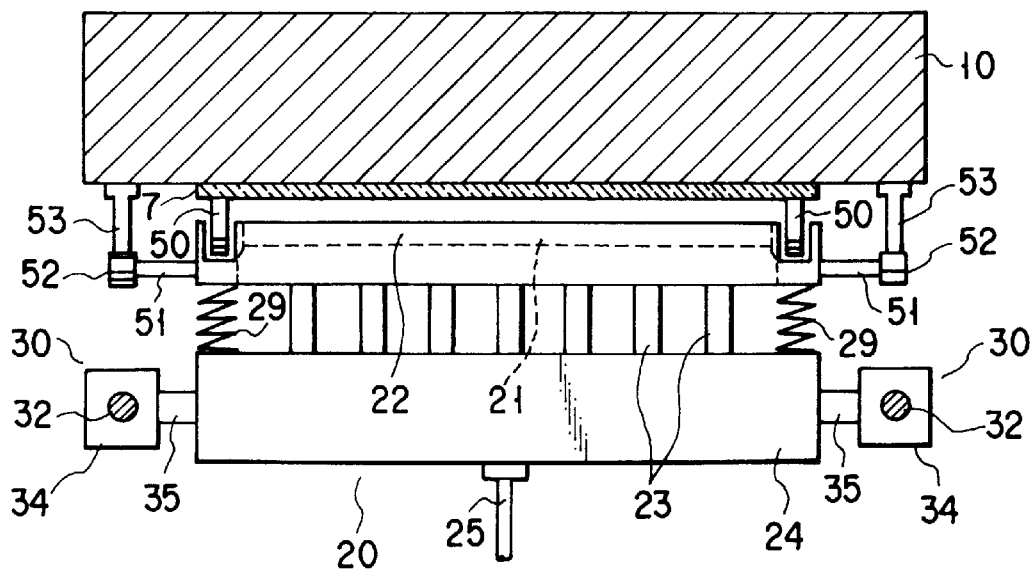
F I G. 4

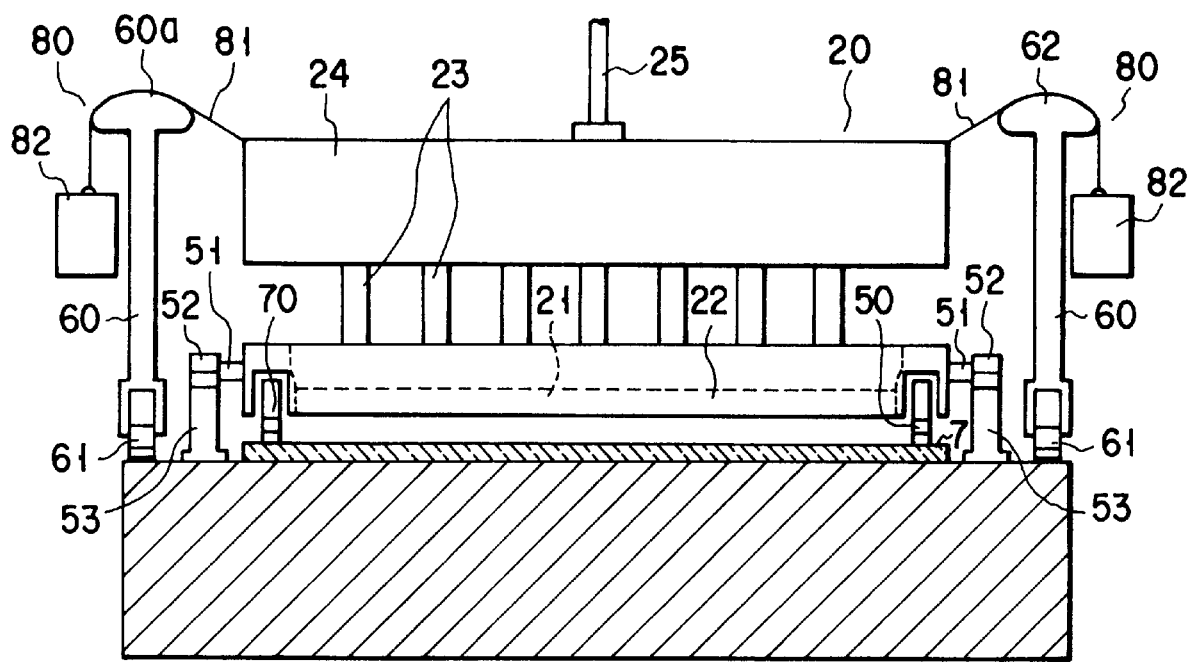
F I G. 10
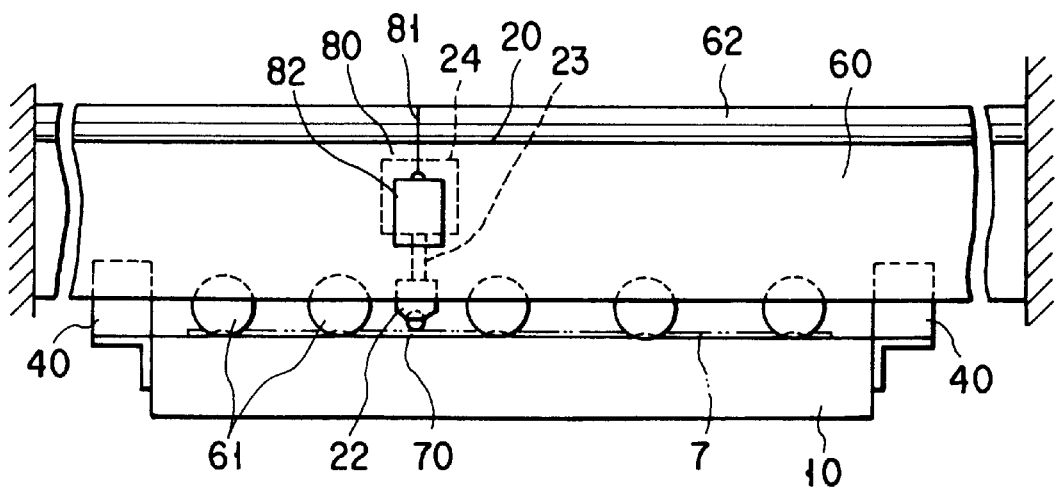
F I G. 11

APPARATUS FOR FORMING COATING FILM FOR SEMICONDUCTOR PROCESSING

BACKGROUND OF THE INVENTION

The present invention relates to an apparatus for forming a coating film for semiconductor processing, particularly, to an apparatus in which a thin plate-like substrate such as a semiconductor wafer or a substrate of a liquid crystal display (LCD) device is coated with a processing solution such as a photoresist solution or a developing solution for forming a coating film on the substrate. The term "semiconductor processing" noted above represents various treatments for forming a semiconductor device, wirings and electrodes, which are connected to a semiconductor device, etc. by forming predetermined patterns of a semiconductor layer, an insulating layer, a conductive layer, etc. on a semiconductor wafer, an LCD substrate, etc.

In the manufacture of a semiconductor device or an LCD device, an apparatus for forming a coating film is used in many cases. For example, the apparatus is used for forming a coating film by coating a substrate with a processing solution such as a photoresist solution or a developing solution.

FIGS. 1A to 1C are cross sectional views collectively showing a conventional apparatus for forming a coating film used in the manufacture of a semiconductor device or an LCD device. As shown in FIG. 1A, the apparatus, which is called a cap coater, comprises a tank 1 having a coating solution 2 housed therein. A nozzle 3 is arranged within the tank 1. These tank 1, coating solution 2 and nozzle 3 collectively constitute a coating solution supply means 4. The nozzle 3 is constructed to spurt upward the coating solution 2 to form a band-like upward stream. During operation of the apparatus, the height of the nozzle 3 is controlled as shown in FIG. 1B or FIG. 1C.

A substrate 6 such as a semiconductor wafer or an LCD substrate is held by a chuck plate 5 and arranged to face the nozzle 3. For forming a coating film on the substrate 6, the coating solution is supplied through the tip of the nozzle 3 onto the substrate 6, and the coating solution supply means 4 is moved in parallel and relative to the substrate 6, as shown in FIG. 1B.

In the apparatus shown in FIGS. 1A to 1C, the discharge port of the nozzle 3 can be made long in a direction perpendicular to the moving direction of the nozzle 3 such that band-like stream of the spurting solution covers the entire width of the substrate 6. In this case, a desired coating film can be formed by a single coating operation, making it possible to form the coating film promptly in a short time.

However, a coating apparatus used in the manufacture of a semiconductor device or an LCD device is required in recent years to be capable of forming a coating film of a uniform thickness, which does not contain cells, and is also required not to give impact to the substrate in addition to the capability of forming a coating film promptly in a short time. The conventional coating apparatus shown in FIGS. 1A to 1C is unable to meet the above-noted requirements.

An extensive research is being made in an attempt to meet the particular requirements. For example, disclosed in Japanese Patent Disclosure (Kokai) No. 4-124812 is a technical idea that a coating film is formed by using a nozzle constructed such that the discharge port, through which the coating solution is spurted upward to form a band-like stream, is connected to a coating solution reservoir via a plurality of fine tubes. Further, disclosed in Japanese Patent Disclosure No. 5-55133 is a technical idea that a coating film is formed by using a nozzle arranged above a spin chuck for holding a semiconductor wafer. In this case, the nozzle comprises a coating solution reservoir having a rectangular cross section and a plurality of fine holes made in the bottom portion of the reservoir. Still further, disclosed in Japanese Patent Disclosure No. 7-326554 is a coating film-forming apparatus comprising a nozzle for supplying a developing solution. The nozzle in this prior art includes a plurality of nozzle holes arranged in a bottom portion of a developing solution chamber and a pressure buffering member arranged in the vicinity of the nozzle holes for suppressing the pressure fluctuation of the developing solution.

The prior arts exemplified above teach that a coating film can be formed accurately on a substrate having a uniform thickness. However, a semiconductor wafer or an LCD substrate is not necessarily uniform in thickness.

FIG. 2 shows a cross section of a general substrate such as a semiconductor wafer or an LCD substrate. It should be noted that a thickness $d_1$ at one end of a substrate 7 held by a chuck plate 10 differs from a thickness $d_2$ at the other end of the substrate 7. Where the substrate 7 has a thickness of about, for example, 1 mm, the difference between $d_1$ and $d_2$ reaches as much as scores of microns in some cases. Where the substrate is not uniform in thickness, the distance at one end of the substrate between the discharge port of the nozzle and the coating surface of the substrate appreciably differs from that at the other end, even if the chuck plate for holding the substrate is held perfectly horizontal. In other words, it is impossible to maintain constant the distance between the nozzle and the substrate over the entire region of the substrate.

Where the distance between the discharge port of the nozzle and the coating surface of the substrate is not uniform, the coating solution fails to assume a uniform condition over the entire region of the substrate. The non-uniform condition does not bring about a problem in the case where subtle treatments are not required. When it comes to the manufacture of a semiconductor device or an LCD device, however, the coating film, e.g., a resist film, is as thin as about 1.5 to 2.0 $\mu$m. On the other hand, the variation in the distance between the discharge port of the nozzle and the coating surface of the substrate is as much as scores of microns. It follows that, in the manufacture of a semiconductor device or an LCD device requiring subtle treatments, only a slight difference in the condition of the coating solution attached to the substrate greatly affects the uniformity of the coating film formed on the substrate. What should be noted is that a nonuniformity in the thickness of the substrate brings about a nonuniform thickness of the resultant coating film, leading to a low yield.

BRIEF SUMMARY OF THE INVENTION

An object of the present invention is to provide an apparatus for forming a coating film for semiconductor processing, which permits forming a thin coating film of a uniform thickness.

According to one embodiment of the present invention, there is provided an apparatus for forming a coating film for semiconductor processing, comprising:

holding means for holding a substrate;

coating solution supply means arranged to face one main surface of the substrate held by the holding means and provided with a discharge port for supplying a coating solution onto the one main surface of the substrate, the coating solution forming a band-like stream having a width smaller than that of the substrate;

moving means for moving the coating solution supply means in parallel and relative to the substrate held by the holding means to form a coating region and a non-coating region on the one main surface of the substrate; and clearance retaining means for maintaining constant the distance between the discharge port of the coating solution supply means and the one main surface of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view showing a coating film-forming apparatus for semiconductor processing according to one embodiment of the present invention;

FIG. 4 is a cross sectional view showing a coating film-forming apparatus for semiconductor processing according to one embodiment of the present invention;

FIG. 10 is a cross sectional view showing a coating film-forming apparatus for semiconductor processing according to another embodiment of the present invention;

FIG. 11 is a cross sectional view showing a coating film-forming apparatus for semiconductor processing according to still another embodiment of the present invention.

DETAILED DESCRIPTION OF THE INVENTION

Figure 1A:
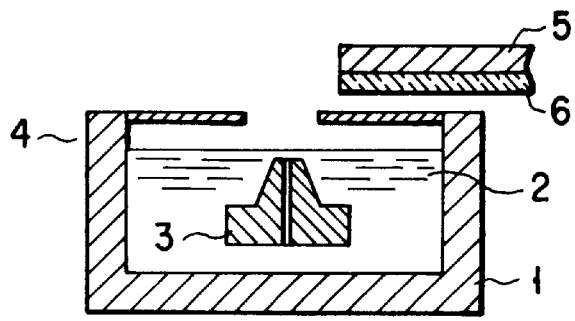
FIGS. 1A to 1C are cross sectional views collectively showing a conventional coating film-forming apparatus used in the manufacture of a semiconductor device or an LCD device.
Figure 1B:
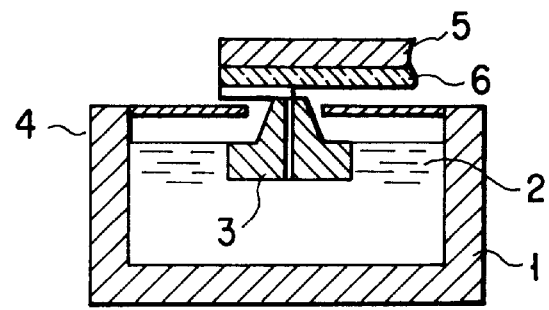
Figure 1C:
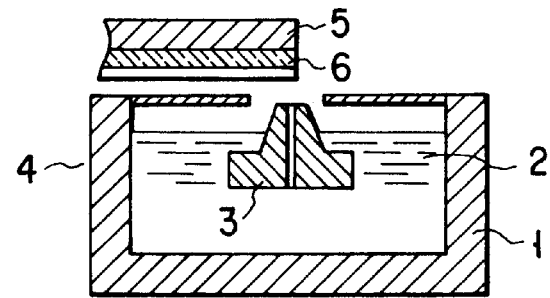
Figure 2:
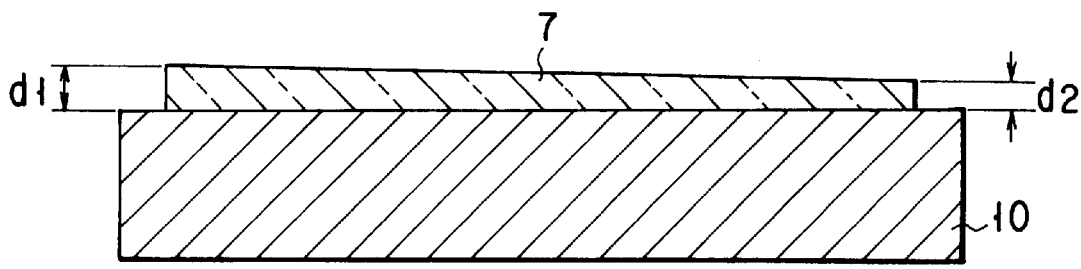
FIG. 2 is a cross sectional view showing a general substrate such as a semiconductor wafer or an LCD substrate.

FIGS. 3 and 4 are a plan view and a cross sectional view, respectively, collectively showing a coating apparatus, i.e., a coating film-forming apparatus, for semiconductor processing according to one embodiment of the present invention. As shown in the drawings, the coating apparatus comprises a holding means, e.g., a chuck plate 10, for horizontally holding a substrate 7 such as an LCD substrate such that the coating surface of the substrate 7 faces downward, a coating solution supply means 20 arranged below the substrate 7 to face the coating surface of the substrate 7, a moving means 30 for moving the coating solution supply means 20 in parallel to the substrate 7, and a clearance retaining means 50 arranged at both end portions of the coating solution supply means 20 to maintain constant the distance between the coating solution supply means 20 and the coating surface of the substrate 7 over the entire region of the substrate 7.

The chuck plate 10 is provided with a vacuum apparatus (not shown). The upper surface of the substrate 7 is attached to the chuck plate 10 by vacuum suction, with the result that the substrate 7 is held by the chuck plate 10.

A pair of moving means 30 is used in the embodiment shown in the drawings. It is seen that each moving means 30 consists of an externally threaded rod 32 arranged below the substrate 7 and rotatably supported by a pair of bearings 31 arranged at both ends of the rod 32, a movable member 34 mounted to the rod 32 and movable in the axial direction of the rod 32 in accordance with rotation of the rod 32, and a motor 33 for rotating the externally threaded rod 32. It should be noted that movement of the movable member 34 causes the coating solution supply means 20 to be moved in parallel to that surface of the chuck plate 10 which holds the substrate 7.

The coating solution supply means 20 consists of a nozzle head 22 arranged to face the coating surface of the substrate 7, a solution reservoir 24 fixed to the movable members 34 at both ends for storing a coating solution, and a tube 23 for supplying the coating solution from the solution reservoir 24 to the nozzle head 22. The solution reservoir 24, which is fixed to the two movable members 34, is movable in the axial direction of the threaded rod 32 in accordance with movement of the movable members 34.

Figure 5:
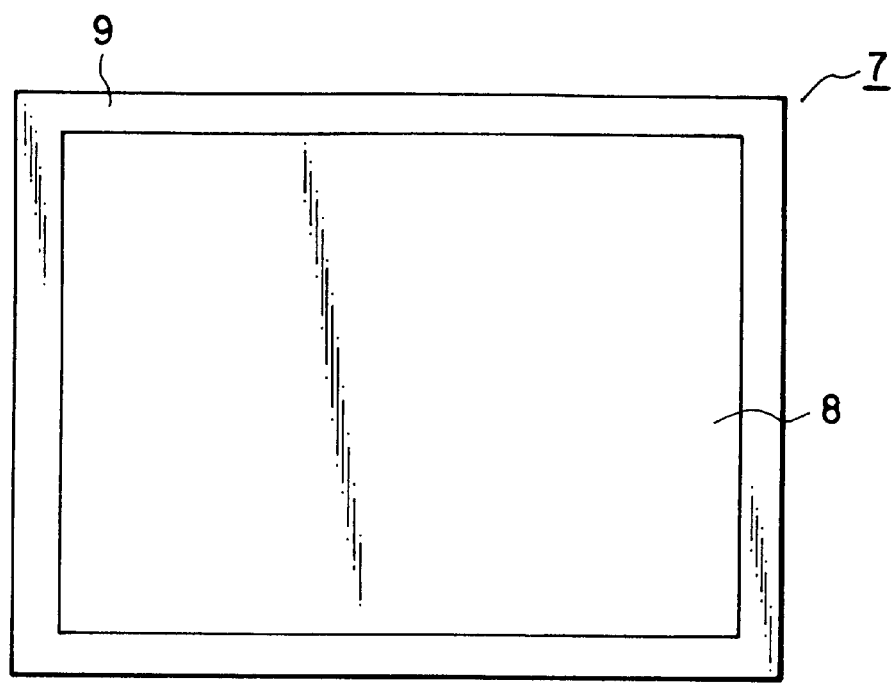
FIG. 5 is a plan view showing a coating region and a non-coating region included in a coating surface of a substrate.

The nozzle head 22 includes a slit-like discharge port 21 extending in a direction perpendicular to the moving direction of the movable member 34. The discharge port 21 is shorter than the width of the substrate 7. The nozzle head 22 is also movable in the axial direction of the externally threaded rod 32 in accordance with movement of the solution reservoir 29. It follows that a coating region 8 and a non-coating region 9 are formed on the coating surface of the substrate 7 as shown in FIG. 5, if the nozzle head 22 is moved in the axial direction of the threaded rod 32 while allowing the nozzle head 22 to spurt the coating solution.

An elastic member such as a pair of springs 29 urging the nozzle head 22 toward the chuck plate 10 are mounted between the nozzle head 22 and the solution reservoir 24. Also, the tube 23 is formed of a member which can be deformed, i.e., elongated or shrunk, upon receipt of force larger than a predetermined magnitude. It follows that the nozzle head 22 is movable in a vertical direction, i.e., toward or away from the coating surface of the substrate 7.

Further, a pair of rollers 50 are arranged at both end portions of the nozzle head 22. The rollers 50, which run along the non-coating region 9 of the substrate 7, act as a clearance retaining means. What should be noted is that the rollers 50 are allowed to run along the non-coating region 9 of the substrate 7. It follows that a predetermined clearance can be maintained between the coating surface of the substrate 7 and the nozzle head 22 over the entire region of the substrate 7, even if the thickness of the substrate 7 is nonuniform. Of course, the coating surface of the substrate 7 and the nozzle head 22 are kept in parallel to each other. It follows that a coating film of a uniform thickness can be formed on the coating surface of the substrate 7.

The solution reservoir 24 is connected to a coating solution supply source 26 via a coating solution supply tube 25. As shown in FIG. 3, a pump 27 and a valve 28 are mounted to the tube 25. These tube 25, coating solution supply source 26, pump 27 and valve 28 collectively form a discharge control means for controlling the discharge of the coating solution from the discharge port 21 of the coating solution supply means 20, as follows. Specifically, if the coating solution is supplied to the solution reservoir 24 by driving the pump 27, with the valve 28 opened, the coating solution is spurted from the nozzle head 22. On the other hand, when operation of the pump 27 is stopped, the valve 28 is closed. As a result, the coating solution ceases to be spurted from the nozzle head 22. Incidentally, it is possible to drive the pump 27 in a reverse direction without closing the valve 28 for allowing the coating solution to cease to be spurted from the nozzle. In this case, the spurting of the coating solution can be stopped promptly, making it possible to prevent an undesired coating solution from being spurted out of the nozzle. It follows that a coating film can be formed accurately in the coating region alone of the substrate.

Driving of the pump 27 is controlled by a controller 71 connected to the pump 27 on the basis of the rotating direction and rotating speed of the externally threaded rod 32, i.e., on the basis of the rotating direction and rotating speed of the motor 33. To be more specific, the on-off control of the pump 27 is performed by the controller 71. Further, the driving direction of the pump 27 is also controlled by the controller 71. Alternatively, it is possible to mount a sensor for detecting the presence or absence of the coating solution supply means 20 at a predetermined position. In this case, the on/off itself and driving direction of the pump 27 are controlled by the controller 71 in response to a signal generated from the particular sensor.

A switching means for allowing the nozzle head 22 to be positioned in the operating position or in the waiting position is included in the coating apparatus shown in FIGS. 3 and 4. Of course, the term "operating position" noted above denotes the case where the discharge port 21 of the nozzle head 22 is positioned close to the substrate 7 so as to be ready for the spurting of the coating solution. On the other hand, the term "waiting position" denotes the case where the discharge port 21 is positioned a predetermined distance apart from the substrate 7.

Figure 6:
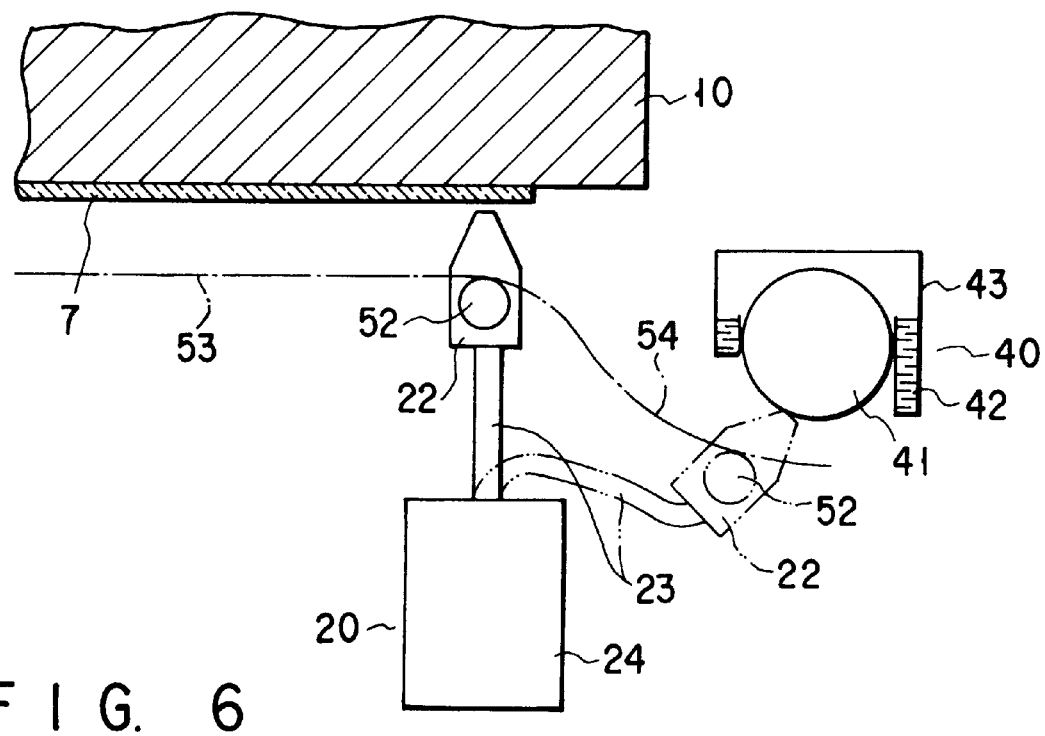
FIG. 6 is a cross sectional view showing a switching means used in a coating film-forming apparatus for semiconductor processing according to one embodiment of the present invention.

The switching means consists of a guide roller 52 mounted to the nozzle head 22 and a stationary guide rail 53, which are shown in FIG. 6. In the coating apparatus of the present invention, a horizontal shaft 51 extending in parallel to the substrate 7 and perpendicular to the axial direction of the threaded shaft 32 is mounted to the nozzle head 22. Also, the guide roller 52 is mounted to each end of the horizontal shaft 51. Further, the guide rail 53 is mounted to that surface of the chuck plate 10 which supports the substrate 7.

Incidentally, the guide roller 52 and the guide rail 53 are arranged not to be in contact with each other when the nozzle head 22 is positioned in the coating region 8 of the substrate 7 and to be in contact with each other when the nozzle head 22 is positioned outside the coating region 8. Also, the guide rail 53, which has a switching portion 54 positioned outside the coating region 8 and projecting toward the solution reservoir 24, serves to perform switching in the position of the nozzle head 22 between the operating position and the waiting position referred to previously in accordance with movement of the nozzle head 22 in a horizontal direction. When the guide roller 52 is moved to the position of the switching portion 54, the nozzle head 22 is moved downward so as to increase the distance between the nozzle head 22 and the substrate 7, compared with the case where the nozzle head 22 is positioned within the coating region 8.

It is desirable to mount in the waiting position noted above a container 43 housing a solvent 42 of the coating solution such that the solvent 42 is supplied onto the surface of the roller 41 in accordance with rotation of the roller 41. The container 43 is arranged to permit the solvent 42 to be supplied from the roller 41 into the discharge port 21 of the nozzle head 22, when the nozzle head 22 stays in its waiting position. It follows that, in the non-coating step, the coating solution is prevented from being hardened or denatured at the discharge port 21 of the nozzle head 22.

The coating apparatus of the present invention, i.e., film-forming apparatus for semiconductor processing constructed as described above, is operated as follows. In the first step, the substrate 7 is transferred by a transfer means (not shown) onto a predetermined position on the holding surface of the chuck plate 10 and sucked by a vacuum apparatus (not shown) so as to be held stationary on the holding surface of the chuck plate 10.

Then, the valve 28 is opened, and the pump 27 is operated, with the result that the coating solution is supplied from the coating solution supply source 26 into the solution reservoir 24 via the coating solution supply tube 25. The coating solution is further supplied from the solution reservoir 24 into the nozzle head 22 through the tubes 23 so as to be spurted from the discharge port 21 mounted at the tip of nozzle head 22. In this step, the nozzle head 22 stays in one of the waiting positions and, thus, the coating solution spurted from the discharge port 21 is discharged onto the roller 41. The coating solution continues to be discharged onto the roller 41 until the discharge rate and composition of the coating solution spurted from the discharge port 21 are stabilized.

After stabilization of the discharge rate and composition of the coating solution, the motor 33 is driven so as to cause the nozzle head 22, which continues to spurt the coating solution, to be moved from one waiting position to the other waiting position. In this step, the nozzle head 22 is guided from the waiting position to the operating position by the guide roller 52 mounted to the nozzle head 22 and the guide rail 53 so as to start coating the coating region 8 of the substrate 7.

If the nozzle head 22 is moved to the operating position, the guide roller 52 is put in a position apart from the guide rail 53, and the rollers 50 mounted at both ends of the nozzle head 22 are brought into contact with the non-coating region of the substrate 7. During movement of the nozzle head 22 within the operating position, the rollers 50 are allowed to run along the non-coating region of the substrate 7, with the result that the non-coating region of the substrate 7 and the discharge port 21 are maintained parallel to each other with a predetermined space provided therebetween. Since the nozzle head 22 is moved in parallel to the substrate 7 while spurting the coating solution, a coating film is formed in the coating region of the substrate 7 in a width determined by the width of the discharge port 21.

When the discharge port 21 has passed through the coating region 8 to reach the non-coating region 9, the guide roller 52 is brought again into contact with the guide rail 53, with the result that the nozzle head 22 is moved away from the substrate 7. In this step, the pump 27 is driven in the reverse direction to permit the coating solution to be sucked back, thereby to stop spurting the coating solution onto the substrate 7.

Further, the nozzle head 22 is moved to the other waiting position. The substrate 7 having a coating film formed thereon in this fashion is transferred by a transfer means (not shown) from the chuck plate 10 to a succeeding process step.

Figure 7A:
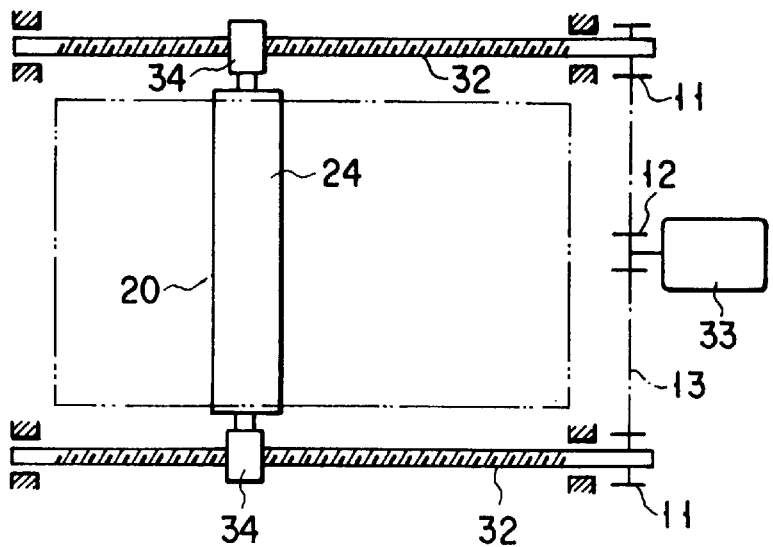
FIGS. 7A to 7C are plan views showing a moving means using an externally threaded rod, which is used in a coating film-forming apparatus for semiconductor processing according to one embodiment of the present invention.
Figure 7B:
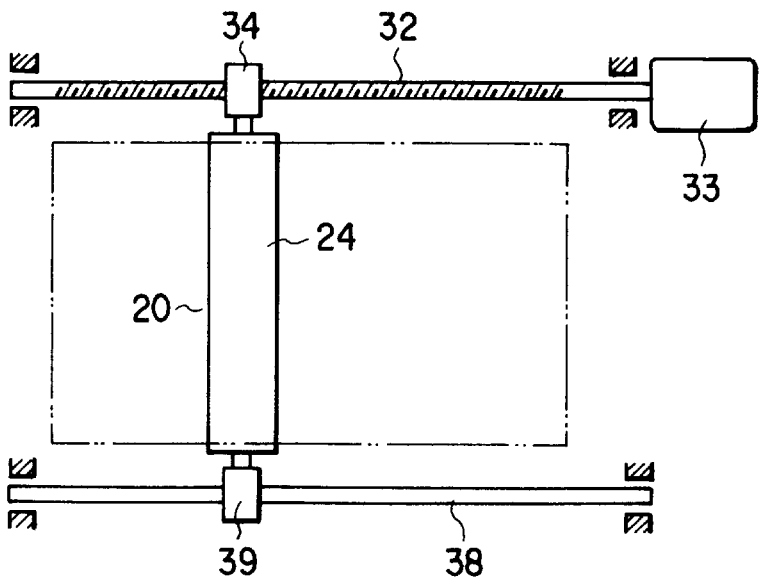
Figure 7C:
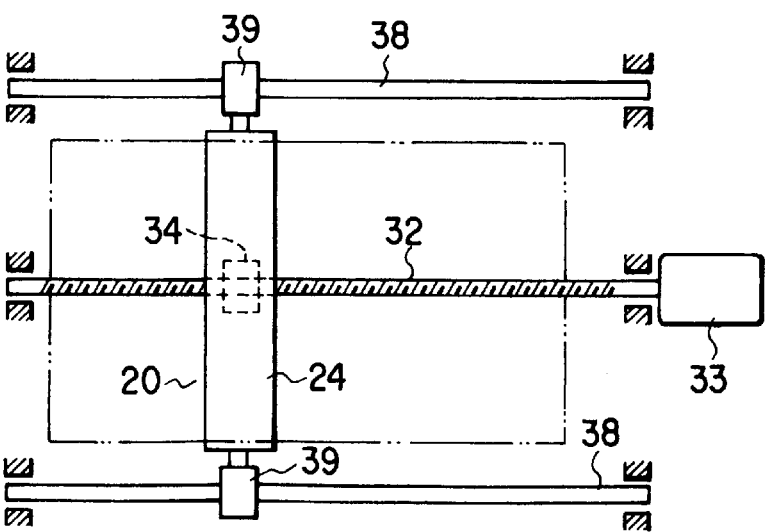

In the coating apparatus of the present invention, the mechanisms shown in FIGS. 7A to 7C can also be used as the moving means 30. Specifically, in the mechanism shown in FIG. 7A, a single motor 30 is used in place of the two motors 33 shown in FIG. 3. As apparent from drawing, the mechanism comprises a driving pulley 12 mounted to the rotating shaft of the motor 30, a driven pulley 11 mounted at one end of each of the two externally threaded rods 32, and a timing belt 13 stretched between each of the two driven pulleys 11 and the driving pulley 12.

The mechanism shown in FIG. 7B comprises the externally threaded rod 32, the movable member 34 mounted to the externally threaded rod 32, the motor 33 joined to one end of the rod 32, a guide rod 38 arranged in parallel to the threaded rod 32, and a slidable member 39 mounted to the guide rod 38. The slidable member 39 is slidable along the guide rod 38. Also, the movable member 34 and the slidable member 39 are fixed to the ends of the coating solution supply means 20.

The mechanism shown in FIG. 7C comprises the externally threaded rod 32, the movable member 34 mounted to the rod 32, the motor 33 joined to one end of the rod 32, a pair of guide rods 38 arranged in parallel to the threaded rod 32, and the slidable member 39 mounted to each of the guide rods 38. In this embodiment, the movable member 34 is fixed to the coating solution supply means 20. On the other hand, the two slidable members 39 are fixed to the ends of the coating solution supply means 20.

Figure 8:
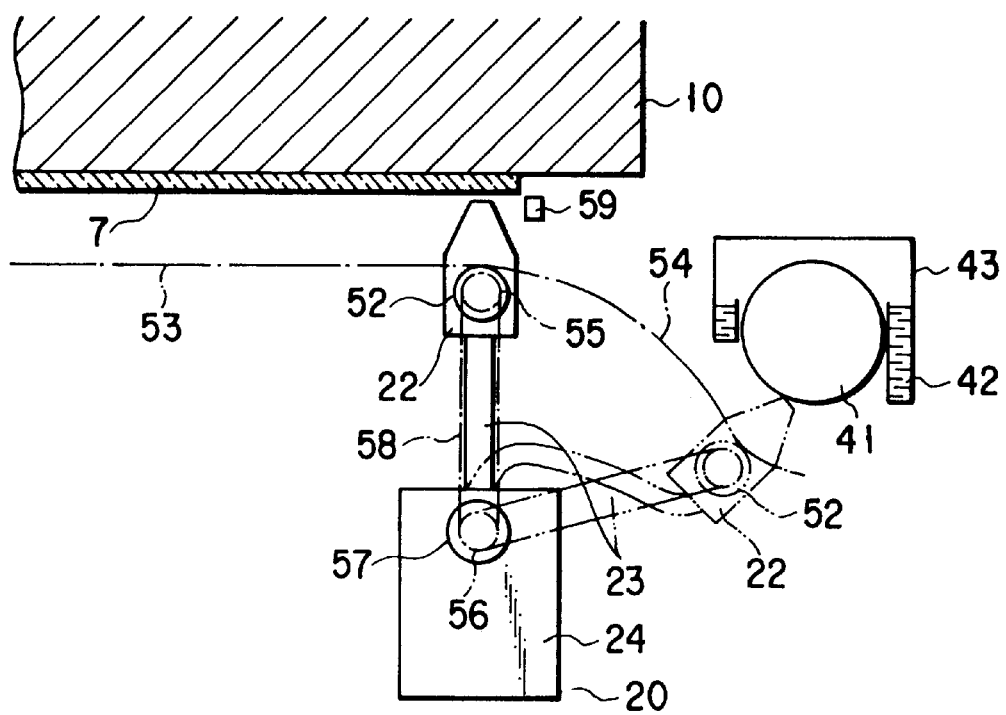
FIG. 8 is a cross sectional view showing a switching means used in a coating film-forming apparatus for semiconductor processing according to one embodiment of the present invention.

In the coating apparatus of the present invention, the switching means for switching the nozzle head 22 between the waiting position and the operating position consists of only the guide rail 53 and the guide roller 52. Alternatively, the switching means may be constructed as shown in FIG. 8. Specifically, a motor 56 is arranged in a side portion of the solution reservoir 24. A driving pulley 57 is mounted to the rotation shaft of the motor 56. On the other hand, a driven pulley 55 is mounted to the shaft of the guide roller 52 mounted in a side portion of the nozzle head 22. Further, a belt 58 is stretched between these driving pulley 57 and driven pulley 55. It follows that, if the motor 56 is driven when the nozzle head 22 stays in the switching portion 54, the nozzle head 22 is moved to the operating position or the waiting position. Specifically, driving of the motor 56 causes the driving pulley 57 to be rotated. In accordance with rotation of the driving pulley 57, the driven pulley 55 is also rotated so as to cause the guide roller 52 to run along the switching portion 54 of the guide rail 53. As a result, the nozzle head 22 is moved to the operating position or the waiting position. Incidentally, the motor 56 is driven in response to a signal generated from, for example, a sensor 59 serving to detect the presence or absence of the nozzle head 22.

In the embodiment described above, the coating solution supply means 20 is arranged below the substrate 7 and the chuck plate 10 supporting the substrate 7. Alternatively, it is possible to arrange the coating solution supply means 20 above the substrate 7 and the chuck plate 10.

Figure 9:
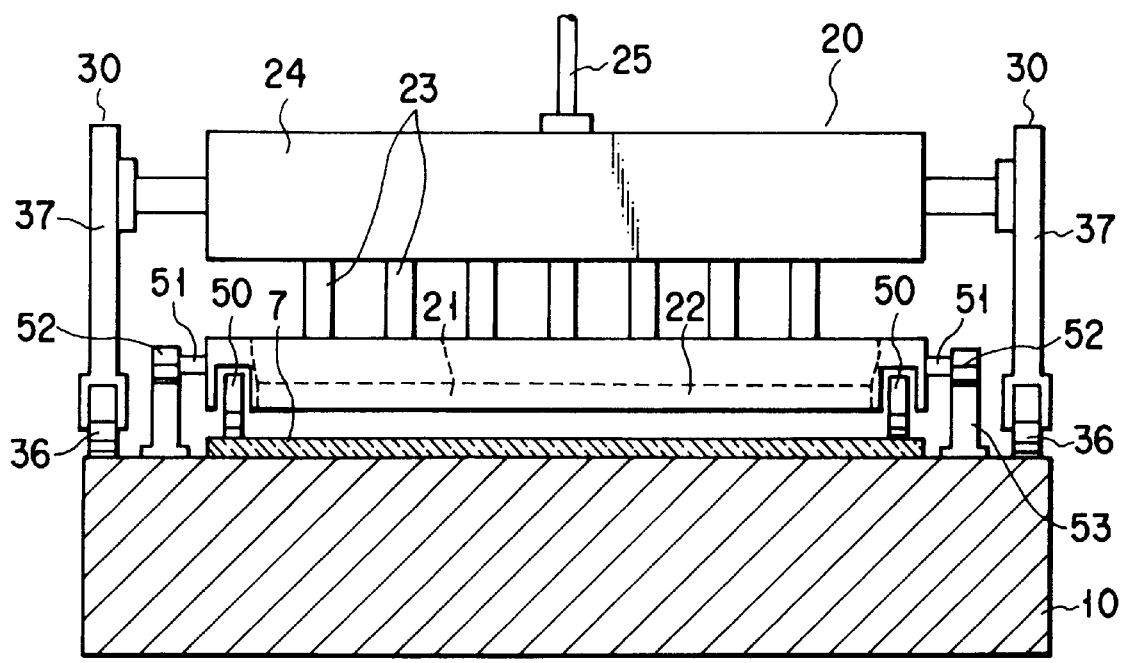
FIG. 9 is a cross sectional view showing a coating film-forming apparatus for semiconductor processing according to another embodiment of the present invention.

FIG. 9 is a cross sectional view showing a coating apparatus according to another embodiment of the present invention. As apparent from the drawing, the coating apparatus shown in FIG. 9 is substantially equal in construction to the apparatus shown in FIG. 4, except that the apparatus shown in FIG. 4 is turned upside down to constitute the apparatus shown in FIG. 9. If the nozzle head 22 is positioned above the substrate 7 as shown in FIG. 9, the spring 29 shown in FIG. 4 need not be arranged between the nozzle head 22 and the solution reservoir 24 because the nozzle head 22 is gravitationally pushed against the substrate 7.

Also, in the coating apparatus shown in FIG. 9, the moving means 30 comprises a pair of support members 37 arranged at both end portions of the solution reservoir 24 for supporting the reservoir 24 and a pair of moving rollers 36 mounted to the lower ends of the support members 37 for moving the support members 37 in parallel to that surface of the chuck plate 10 which supports the substrate 7. In the construction in which the coating solution supply means 20 is positioned above the substrate 7, the moving means 30 shown in FIG. 9 can be used in addition to the moving means 30 shown in FIG. 4.

In any of the embodiments described above, the coating solution supply means 20 is moved horizontally. However, it is also possible to move the substrate 7 and the chuck plate 10 within horizontal planes, with the coating solution supply means 20 held stationary.

FIGS. 10 and 11 collectively show a coating film-forming apparatus (coating apparatus) for semiconductor processing according to still another embodiment of the present invention. In this embodiment, a pair of support members 60 for supporting the coating solution supply means 20 are held stationary, with the chuck plate 10 and the nozzle head 22 made movable in the horizontal and vertical directions, respectively.

In the embodiment shown in FIGS. 10 and 11, the paired support members 60 for supporting the coating solution supply means 20 are arranged in parallel to each other and held stationary. As seen from FIG. 11, a plurality of rollers 61 arranged in series are mounted to the lower portion of each of the support members 60. The chuck plate 10 is pushed toward the support members 60 such that the substrate-holding surface of the chuck plate 10 is brought into contact with the rollers 61, and is movable in a direction parallel to the substrate 7.

The coating apparatus shown in FIGS. 10 and 11 also comprises a weight-reducing means comprising the support member 60, a wire 81 stretched over an upwardly swelling portion 62 of the support member 60 and having one end joined to the solution reservoir 24, and a balance weight 82 hanging from the other end of the wire 81. In the case of using the weight-reducing means of the particular construction, the pressure applied from the rollers 50 to the substrate 7 can be controlled, as desired, by changing the weight of the balance weight 82, making it possible to suppress the damage done to the substrate 7 by the pressure applied from the rollers 50.

The coating apparatus shown in FIGS. 10 and 11 also comprises the switching means referred to previously. Specifically, the guide rail 53 is moved in a horizontal direction in accordance with movement of the chuck plate 10 in a horizontal direction so as to achieve switching of the nozzle head 22 between the operating position and the waiting position. In this embodiment, waiting portions 40 of the nozzle head 22 are fixed to the end portions in the moving direction of the chuck plate 10 so as to permit the waiting portions 40 to be moved in a horizontal direction in accordance with movement of the chuck plate 10 in a horizontal direction.

As described previously, the coating apparatus shown in FIGS. 10 and 11 comprises a weight-reducing means. However, it is possible to omit the weight-reducing means by fixing the position of the solution reservoir 24 relative to the support member 60. Further, one end of the wire 81 is joined to the solution reservoir 24 in this embodiment for controlling appropriately the pressure applied from the rollers 50 to the substrate 7. Alternatively, the pressure control can be achieved by joining one end of the wire 81 to a vertically movable member of the coating solution supply means 20 such as the nozzle head 22 while fixing the position of the solution reservoir 24 relative to the support member 60.

The coating apparatus of the present invention described above permits forming a coating film such as a resist film of a uniform thickness, which does not contain cells, in a short time on a substrate without giving impact to the substrate. Also, the apparatus permits selectively forming a coating film on the coating region alone of the substrate. In other words, since an undesired coating film is not formed in the non-coating region of the substrate, it is unnecessary to carry out a treatment for removing the coating film formed in the non-coating region. Further, since a coating film can be formed selectively in the coating region alone of the substrate, it is possible to decrease the amount of the coating solution required for forming a desired coating film.

In any of the embodiments described above, the coating apparatus is used for forming a resist coating film on an LCD substrate made of, for example, glass. However, the apparatus can also be used in a developing apparatus. Further, the apparatus can be used for forming a coating film of a process solution such as a polyimide series coating solution (PIQ) or a glass-containing coating solution (SOG).

The coating apparatus of the present invention permits forming a coating film most efficiently when used for forming a coating film on a rectangular substrate such as an LCD substrate, as in the embodiments shown in the accompanying drawings. However, the apparatus can also be used for forming a coating film on a circular substrate such as a semiconductor wafer or a compact disc (CD). Further, the apparatus can be used for forming a green film on an electric board.

Throughout the description given above, the common members of the coating apparatus are denoted by the same reference numerals so as to omit the overlapping description in respect of, for example, the operations thereof.

The coating film-forming apparatus (coating apparatus) of the present invention for semiconductor processing can be used singly for forming, for example, a resist coating film on an LCD substrate as in the embodiments shown in the accompanying drawings. Further, the apparatus can be incorporated in a resist coating-developing system of a substrate such as an LCD substrate.

Figure 12:
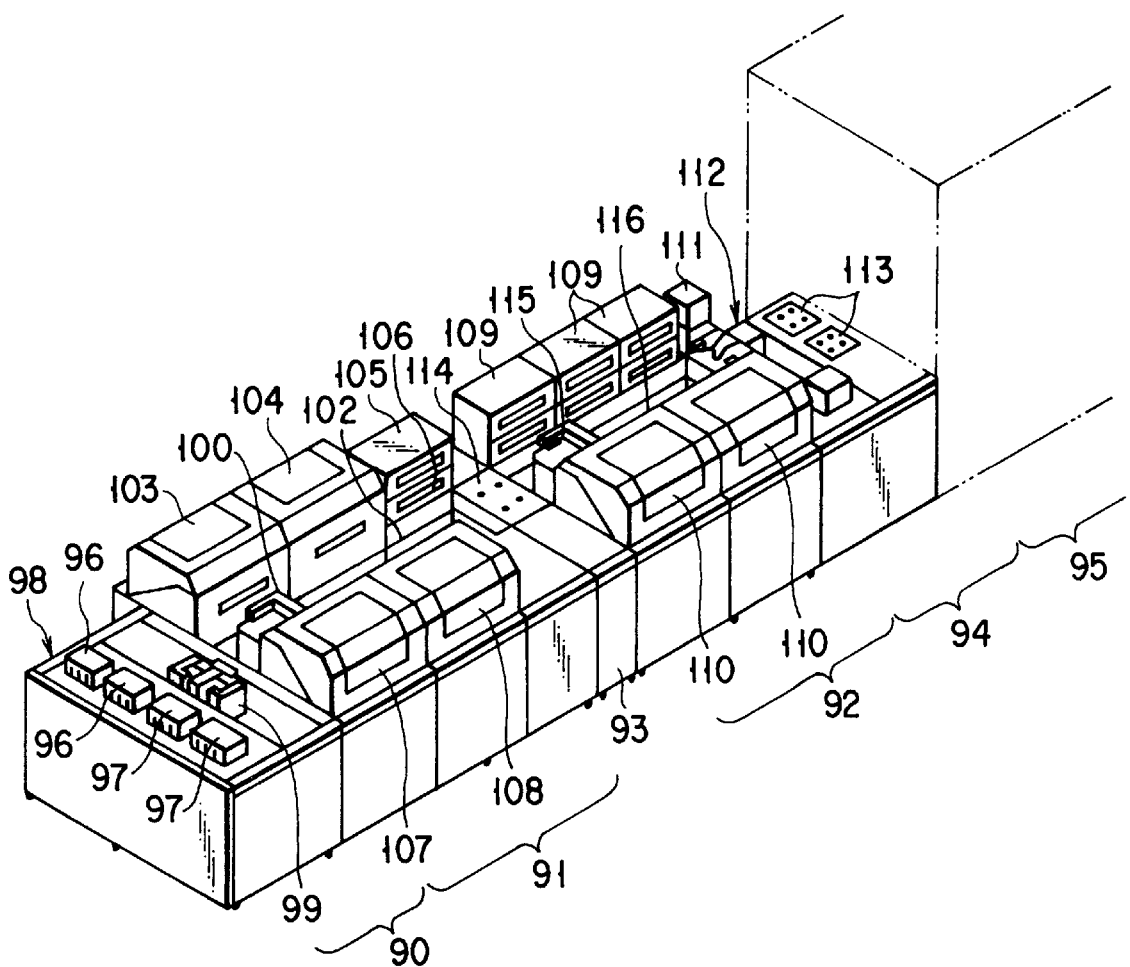
FIG. 12 is an oblique view showing a resist coating-developing system having a coating film-forming apparatus of the present invention incorporated therein.

FIG. 12 is an oblique view showing a resist coating-developing system having a coating apparatus of the present invention incorporated therein. As shown in the drawing, the system comprises mainly a loader section 90, a first processing section 91 for applying a first treatment to the substrate transferred through the loader section 90, and a second processing section 92 disposed adjacent to the first processing section 91 for applying a second treatment to the substrate. Further, a relay section 93 is interposed between the first and second processing sections 91 and 92. The resist coating-developing system shown in FIG. 12 is combined with a light-exposure apparatus 95 for exposing the resist film formed on the substrate to light through a mask of a predetermined fine pattern. It is seen that a transfer section 94 is interposed between the second processing section 92 and the developing apparatus 95 for transferring the substrate therebetween.

The loader section 90 included in the resist coating-developing system shown in FIG. 12 comprises cassettes 96 each housing untreated substrates, cassettes 97 each housing treated substrates, a cassette table 98 having the cassettes 96, 97 disposed thereon, and a pair of transfer pincers 99. The pincers 99 serve to take untreated substrates out of the cassettes 96 for transfer of the untreated substrates into the first processing section 91. Likewise, the pincers 99 serve to take the treated substrates out of the first processing section for transfer of the treated substrates into the cassettes 97.

The first processing section 91 comprises washing devices including a brush-washing device 103, and a jet water-washing device 104, an adhesion treating device 105 for applying a treatment to make the substrate hydrophobic, a cooling device 106, a resist coating device 107, a coating film-removing device 108, and a main arm 100 acting as a substrate transfer means. In this embodiment, the coating film-forming apparatus of the present invention for the semiconductor processing is used as the resist coating device 107. As seen from the drawing, these members of the first processing section 91 are arranged side by side on both sides of a transfer path 102 along which the main arm 100 is moved. Also, the main arm 100 is used for the transfer of the substrates between the adjacent member devices of the system, between the member device and the transfer pincers 99, and between the member device and the relay section 93.

A transfer table 114 is arranged on the upper surface of the relay section 93. The substrate treated in the first processing section 91 or in the second processing section 92 are temporarily disposed on the transfer table 114.

The second processing section 92 includes a heating device 109, a developing device 110 and a main arm 115 acting as a substrate transfer means. These member devices are arranged side by side on both sides of a transfer path 116 along which the main arm 115 is moved, as in the first processing section 91. Also, the main arm 115 is used for transfer of the substrates between adjacent member devices, between the member device and the relay section 93, and between the member device and the transfer section 94.

The transfer section 94 includes transfer tables 113 and a pair of transfer pincers 112 for transfer of the substrates between the transfer tables 113 and the developing device 95. It should be noted that the substrates treated in the second processing section 92 or in the developing device 95 are temporarily disposed on the transfer tables 113.

The resist coating-developing system constructed as described above is operated as follows. In the first step, the untreated substrate is taken out of the cassette 96 by the transfer pincers 99 and delivered onto the main arm 100. The substrate held by the main arm 100 is transferred into the brush-washing device 103 for the brush-washing. Then, the substrate is further transferred into the jet water-washing device 103 for washing with a high pressure jet water.

After the washing treatment, the substrate is transferred into the adhesion treating device 105 arranged adjacent to the jet water-washing device 103 for application of a treatment to make the substrate hydrophobic and, then, cooled in the cooling device 106. Further, the hydrophobic substrate is transferred into the resist coating device 107, i.e., the coating apparatus of the present invention, for formation of a resist film on the surface.

After formation of the resist film, an undesired portion of the resist film in the peripheral portion and side portion of the substrate is removed in the coating film removing device 108. Then, the substrate is transferred by the main arm 100 onto the transfer table 114. The substrate is further transferred by the main arm 115 from the substrate table 114 into the heating device 109 for application of a baking treatment to the resist film formed on the substrate. After the baking treatment, the substrate is disposed on the substrate table 113 by the main arm 115 and, then, transferred into the light-exposing device 95 by the transfer pincers 112 for exposure to light in a predetermined pattern.

After exposure to light, the substrate is transferred again by the pincers 112 from the light-exposing device 95 onto the substrate table 113. Then, the substrate is transferred by the main arm 115 into the developing device 110 for application of developing treatments including development with a developing solution and washing with a rinsing solution. After the developing treatment, the substrate is transferred by the main arm 115 onto the substrate table 114 and, then, into the cassette 97 by the main arm 100 and the transfer pincers 99.

In the resist coating-developing system described above, the coating film-forming apparatus (coating apparatus) of the present invention for semiconductor processing is used as the resist coating device, as already pointed out. It follows that the resist coating-developing system shown in FIG. 12 permits forming in a short time a resist film, which does not contain cells, of a uniform thickness without giving an impact to the substrate, making it possible to apply a resist coating-developing treatment to the substrate in a short time to achieve a high yield.

Also, as already pointed out, the coating apparatus of the present invention permits selectively forming a coating film in the coating region alone of the substrate so as to avoid formation of an undesired coating film in the non-coating region of the substrate. It follows that it is unnecessary to use the coating film-removing device 108 in the case where the coating apparatus of the present invention is used as the resist coating device 107. Further, since a coating film can be formed selectively in the coating region alone of the substrate, the amount of the resist solution used can be decreased in the case of using the coating apparatus of the present invention.

In the embodiment shown in FIG. 12, the coating apparatus of the present invention is used as the resist coating device included in the resist coating-developing system. Alternatively, the coating apparatus of the present invention can be used as the developing device included in the resist coating-developing system shown in FIG. 12. In this case, the development can be achieved uniformly because a developing solution can be coated uniformly, making it possible to apply a resist coating-developing treatment to the substrate in a short time with a high yield.

Further, since the coating apparatus of the present invention permits forming a coating film selectively in the coating region alone of the substrate, the amount of the developing solution used can be decreased in the case of using the coating apparatus of the present invention as the developing device included in the system shown in FIG. 12.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An apparatus for forming a coating film for semiconductor processing, comprising:

holding means for holding a substrate;

coating solution supply means arranged to face one main surface of the substrate held by said holding means and provided with a discharge port for supplying a coating solution onto said one main surface of the substrate, said coating solution forming a band-like stream having a width smaller than that of the substrate;

moving means for moving said coating solution supply means in parallel and relative to the substrate held by the holding means to form a coating region and a non-coating region on the one main surface of the substrate; and clearance retaining means for maintaining constant the distance between the discharge port of the coating solution supply means and the one main surface of the substrate.

2. The apparatus according to claim 1, wherein said discharge port of the coating solution supply means is positioned below the substrate held by said holding means.

3. The apparatus according to claim 1, wherein said discharge port of the coating solution supply means is positioned above the substrate held by said holding means.

4. The apparatus according to claim 3, further comprising weight reducing means for reducing the pressure applied from said coating solution supply means to the substrate held by said holding means.

5. The apparatus according to claim 4, wherein said weight reducing means comprises a wire having one end connected to said coating solution supply means, a balance weight connected to the other end of said wire, and a support member about which said wire extends for supporting said coating solution supply means.

6. The apparatus according to claim 1, wherein said coating solution supply means can be moved horizontally by said moving means.

7. The apparatus according to claim 6, wherein said moving means comprises an externally threaded rod which is stationary relative to the substrate held by said holding means and parallel to the other main surface of the substrate, and a movable member mounted to said threaded rod and movable in accordance with rotation of the threaded rod, said coating solution supply means being joined to said movable member.

8. The apparatus according to claim 6, wherein said moving means comprises a support member for supporting said coating solution supply means, and a roller mounted to said support member to enable the support member to be moved horizontally.

9. The apparatus according to claim 1, wherein said holding means can be moved horizontally by said moving means.

10. The apparatus according to claim 9, wherein said moving means comprises a support member, which is fixed stationary, for supporting said coating solution supply means, and a roller mounted to said support member to enable said holding means to be moved horizontally.

11. The apparatus according to claim 1, wherein said clearance retaining means permits the discharge port of the coating solution supply means to be moved in a direction perpendicular to one main surface of the substrate held by the holding means.

12. The apparatus according to claim 1, wherein said clearance retaining means comprises a pair of rollers arranged at both ends of the discharge port of the coating solution supply means to run along the non-coating region on one main surface of the substrate.

13. The apparatus according to claim 1, wherein said coating solution supply means comprises a solution reservoir housing a coating solution, a nozzle head movable in a vertical direction and including said discharge port, and deformable tubes for supplying the coating solution from the solution reservoir into the nozzle head.

14. The apparatus according to claim 13, further comprising switching means which permits said discharge port to be positioned close to the substrate when the discharge port is positioned within the coating region of the substrate held by the holding means and also permits the discharge port to stay in a waiting position away from the substrate when the discharge port is positioned outside said coating region.

15. The apparatus according to claim 14, wherein said switching means comprises a guide rail which is stationary relative to the substrate held by the holding means and a guide roller which is stationary relative to the discharge port, said guide rail being shaped such that, when the discharge port is positioned within the coating region of the substrate, the guide rail is positioned away from the guide roller and, when the discharge port is positioned outside the coating region, the guide rail is brought into contact with the guide roller.

16. The apparatus according to claim 15, further comprising a motor mounted in said solution reservoir, a driving pulley mounted to the rotating shaft of said motor, a driven pulley mounted to the shaft of the guide roller, a belt stretched between said driving pulley and said driven pulley, a sensor for detecting the presence of said coating solution supply means in a predetermined position, and a controller for performing the on/off control of the motor and for controlling the driving direction of the motor in response to a signal supplied from said sensor.

17. The apparatus according to claim 14, wherein said waiting position includes a waiting portion for supplying a solvent to the discharge port of the nozzle head.

18. The apparatus according to claim 14, wherein said waiting portion comprises a container housing a solvent of said coating solution and a roller rotatably mounted in said container for supplying a solvent to the nozzle head when the discharge port is positioned in said waiting position.

19. The apparatus according to claim 1, wherein said holding means consists of a chuck plate.

20. The apparatus according to claim 1, further comprising discharge control means for controlling the discharge of the coating solution from the discharge port of said coating solution supply means.

21. The apparatus according to claim 20, wherein said discharge control means comprises a coating solution supply source housing a coating solution which is to be supplied to said coating solution supply means, a supply tube having one end connected to said coating solution supply source and the other end connected to said solution reservoir, a valve mounted to said supply tube, and a pump mounted to the supply tube and positioned between said valve and the solution reservoir.

22. The apparatus according to claim 21, further comprising a controller for performing the on/off control of said pump in accordance with the position and moving direction of the discharge port.

23. The apparatus according to claim 1, wherein said clearance retaining means is arranged in a longitudinal direction of said discharge port.

24. The apparatus according to claim 1, wherein said clearance retaining means maintains constant the distance between said discharge port of the coating solution supply means and said one main surface of the substrate by contacting said one main surface of the substrate.

* * * * *